(12) United States Patent
Sadovnikov et al.

(10) Patent No.: US 11,152,505 B2
(45) Date of Patent: Oct. 19, 2021

(54) DRAIN EXTENDED TRANSISTOR

(71) Applicant: Texas Instruments Incorporated, Dallas, TX (US)

(72) Inventors: Alexei Sadovnikov, Sunnyvale, CA (US); Andrew Derek Strachan, Santa Clara, CA (US); Henry Litzmann Edwards, Garland, TX (US); Dhanoop Varghese, Plano, TX (US); Xiaoju Wu, Dallas, TX (US); Binghua Hu, Plano, TX (US); James Robert Todd, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 139 days.

(21) Appl. No.: 16/021,601

(22) Filed: Jun. 28, 2018

(65) Prior Publication Data
US 2020/0006549 A1 Jan. 2, 2020

(51) Int. Cl.
| | |
|---|---|
| H01L 29/78 | (2006.01) |
| H01L 29/66 | (2006.01) |
| H01L 29/10 | (2006.01) |
| H01L 21/265 | (2006.01) |
| H01L 29/08 | (2006.01) |
| H01L 21/266 | (2006.01) |

(52) U.S. Cl.
CPC ........ *H01L 29/7816* (2013.01); *H01L 21/266* (2013.01); *H01L 21/26513* (2013.01); *H01L 29/0878* (2013.01); *H01L 29/0882* (2013.01); *H01L 29/1045* (2013.01); *H01L 29/66681* (2013.01)

(58) Field of Classification Search
CPC ........... H01L 29/7816; H01L 29/66681; H01L 29/0878; H01L 29/1045; H01L 29/0856–0869; H01L 29/0873–0886; H01L 29/7833–7836; H01L 29/36
See application file for complete search history.

(56) References Cited

U.S. PATENT DOCUMENTS

| | | | |
|---|---|---|---|
| 6,251,744 B1 * | 6/2001 | Su ..................... | H01L 21/76213 257/E21.556 |
| 6,274,422 B1 * | 8/2001 | Wakita ................ | H01L 27/0629 438/238 |
| 6,587,320 B1 | 7/2003 | Russ et al. | |
| 7,141,455 B2 * | 11/2006 | Hu ........................ | H01L 21/266 438/135 |
| 7,696,049 B2 | 4/2010 | Hu et al. | |

(Continued)

*Primary Examiner* — Shahed Ahmed
*Assistant Examiner* — Khatib A Rahman
(74) *Attorney, Agent, or Firm* — Andrew R. Ralston; Charles A. Brill; Frank D. Cimino

(57) ABSTRACT

Described examples include integrated circuits, drain extended transistors and fabrication methods in which an oxide structure is formed over a drift region of a semiconductor substrate, and a shallow implantation process is performed using a first mask that exposes the oxide structure and a first portion of the semiconductor substrate to form a first drift region portion for connection to a body implant region. A second drift region portion is implanted in the semiconductor substrate under the oxide structure by a second implantation process using the first mask at a higher implant energy.

24 Claims, 13 Drawing Sheets

(56) References Cited

U.S. PATENT DOCUMENTS

| | | | |
|---|---|---|---|
| 7,713,825 B2* | 5/2010 | Hu | H01L 21/26513 |
| | | | 438/279 |
| 7,732,863 B2* | 6/2010 | Pendharkar | H01L 29/66712 |
| | | | 257/343 |
| 7,745,294 B2 | 6/2010 | Pendharkar et al. | |
| 7,772,075 B2 | 8/2010 | Pendharkar et al. | |
| 7,772,644 B2 | 8/2010 | Pendharkar et al. | |
| 7,893,499 B2 | 2/2011 | Denison et al. | |
| 7,960,222 B1* | 6/2011 | Kwon | H01L 27/0921 |
| | | | 438/197 |
| 7,989,232 B2 | 8/2011 | Wand et al. | |
| 8,114,744 B2 | 2/2012 | Chatterjee et al. | |
| 8,124,482 B2 | 2/2012 | Denison et al. | |
| 8,253,193 B2 | 8/2012 | Denison et al. | |
| 8,264,038 B2 | 9/2012 | Pendharkar et al. | |
| 8,686,502 B2 | 4/2014 | Raghavan et al. | |
| 8,704,271 B2 | 4/2014 | Edwards et al. | |
| 9,006,833 B2 | 4/2015 | Edwards et al. | |
| 9,076,863 B2 | 7/2015 | Tamura et al. | |
| 9,306,013 B2 | 4/2016 | Babcock et al. | |
| 9,461,032 B1 | 10/2016 | Edwards | |
| 9,543,430 B2 | 1/2017 | Edwards | |
| 9,583,612 B1* | 2/2017 | Edwards | H01L 21/266 |
| 9,608,105 B2 | 3/2017 | Tamura et al. | |
| 9,633,994 B2 | 4/2017 | Babcock et al. | |
| 9,698,246 B1 | 7/2017 | Edwards et al. | |
| 9,887,288 B2 | 2/2018 | Edwards et al. | |
| 2003/0109112 A1* | 6/2003 | Wu | H01L 21/76202 |
| | | | 438/400 |
| 2004/0027745 A1* | 2/2004 | Kunz | H01L 27/0266 |
| | | | 361/56 |
| 2004/0079974 A1 | 4/2004 | Lin et al. | |
| 2004/0140517 A1* | 7/2004 | Tsuchiko | H01L 29/42364 |
| | | | 257/493 |
| 2006/0113588 A1* | 6/2006 | Wu | H01L 29/7813 |
| | | | 257/330 |
| 2006/0141714 A1* | 6/2006 | Lee | H01L 21/823892 |
| | | | 438/275 |
| 2006/0186467 A1* | 8/2006 | Pendharkar | H01L 29/749 |
| | | | 257/337 |
| 2007/0158754 A1* | 7/2007 | Soma | H01L 21/8249 |
| | | | 257/370 |
| 2009/0191688 A1 | 7/2009 | Hu et al. | |
| 2010/0117150 A1* | 5/2010 | Pendharkar | H01L 21/823814 |
| | | | 257/337 |
| 2011/0156682 A1* | 6/2011 | Girdhar | H01L 29/7835 |
| | | | 323/283 |
| 2011/0198718 A1* | 8/2011 | Takada | H01L 27/14689 |
| | | | 257/443 |
| 2012/0086497 A1 | 4/2012 | Vorhaus | |
| 2013/0240980 A1 | 9/2013 | Raghavan et al. | |
| 2014/0021540 A1* | 1/2014 | Khayat | H01L 29/0692 |
| | | | 257/337 |
| 2014/0346598 A1* | 11/2014 | Han | H01L 29/7833 |
| | | | 257/345 |
| 2014/0353749 A1* | 12/2014 | Hebert | H01L 29/66659 |
| | | | 257/337 |
| 2016/0087081 A1* | 3/2016 | You | H01L 29/66681 |
| | | | 257/336 |
| 2016/0343853 A1* | 11/2016 | Toh | H01L 29/78612 |
| 2017/0077294 A1 | 3/2017 | Edwards | |
| 2017/0084738 A1 | 3/2017 | Zhang et al. | |
| 2017/0125252 A1* | 5/2017 | Strachan | H01L 29/7816 |
| 2017/0179260 A1* | 6/2017 | Edwards | H01L 27/0928 |
| 2017/0243940 A1* | 8/2017 | Schmidt | H01L 21/04 |
| 2018/0308745 A1* | 10/2018 | Chuang | H01L 29/66568 |

* cited by examiner

DRAIN EXTENDED TRANSISTOR

CROSS-REFERENCE TO RELATED APPLICATIONS

This application is related to co-pending and co-assigned patent application Ser. No. 16/021,647, entitled "PROTECTION OF DRAIN EXTENDED TRANSISTOR FIELD OXIDE", filed on even date herewith, the entirety of which is hereby incorporated by reference. This application is related to co-pending and co-assigned patent application Ser. No. 16/021,772, entitled "DRAIN CENTERED LDMOS TRANSISTOR WITH INTEGRATED DUMMY PATTERNS", filed on even date herewith, the entirety of which is hereby incorporated by reference.

BACKGROUND

Drain extended transistors are useful in power switching circuits and other applications in which high voltage transistors are integrated with logic and other low voltage transistors on a single integrated circuit (IC). The design of the extended drain combines efficient operation as a low side switch in a switching power supply to provide low source-drain resistance (RDSON) during the on state, along with the ability to block or withstand high off-state voltages between the drain and the source or gate. The extended drain provides a relatively lightly doped drift region to extend the high voltage drain away from the edge of the channel region. A planar drift region can be used to increase the reverse blocking voltage beyond the voltage rating of the gate oxide in a particular process. For even higher drain voltage rating, the drain side of the gate polysilicon is spaced from the drift region by a field relief oxide to facilitate more complete depletion of the drift region. Reduced surface field (RESURF) profiled doping can be used for full reverse bias depletion of the drift region. The drift region doping level or dopant concentration is preferably higher near the connection to the transistor channel region to mitigate channel hot carrier injection into the gate and enhance the transistor reliability.

SUMMARY

Described examples include a drain extended transistor with an oxide structure over a drift region of a semiconductor substrate with an end adjacent a drain region. A first drift region portion having a first dopant concentration extends from a channel portion of a body region to the other end of the oxide structure. A second drift region portion having a lower second dopant concentration extends under the oxide structure. A gate structure includes a gate dielectric layer formed over a side of the substrate, and a gate electrode on the gate dielectric layer. Further described examples include fabrication methods in which a shallow implantation process is performed using a first mask that exposes an oxide structure and a first portion of a semiconductor substrate to form a first drift region portion for connection to a body implant region. A second implantation process is performed at a higher implant energy using the first mask to form a second drift region portion in the semiconductor substrate under the oxide.

DETAILED DESCRIPTION

Figure 1:
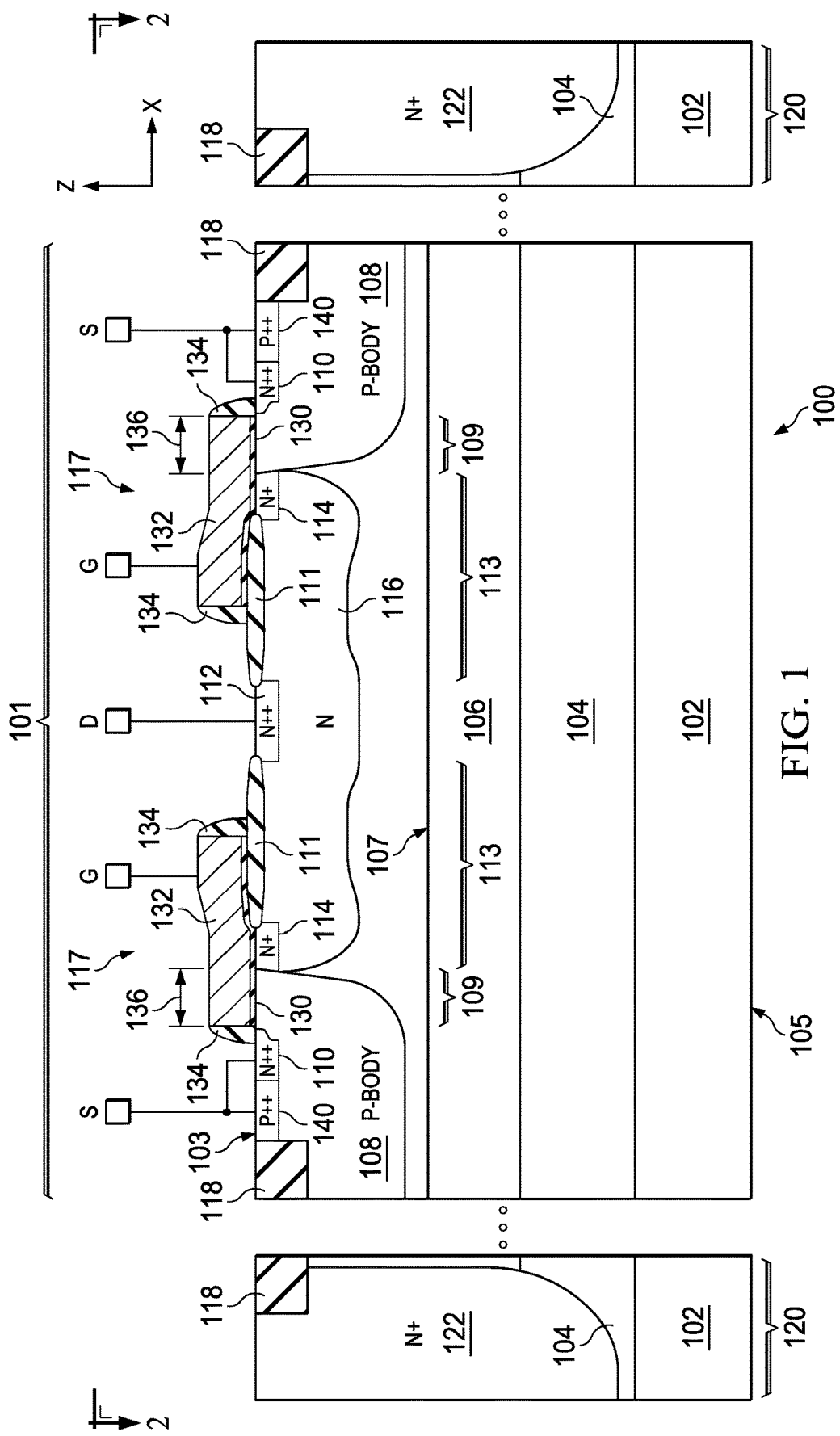
FIG. 1 is a partial sectional side elevation view of an integrated circuit including a drain extended transistor with first and second drift region portions.

FIG. 1 shows a partial view of an integrated circuit (IC) 100 with a drain extended transistor 101 fabricated from a semiconductor substrate 102. In the drawings, like reference numerals refer to like elements throughout, and the various features are not necessarily drawn to scale. In the following discussion and in the claims, the terms "including", "includes", "having", "has", "with", or variants thereof are intended to be inclusive in a manner similar to the term "comprising", and thus should be interpreted to mean "including, but not limited to". Drain extended transistors can include drain-extended NMOS (DENMOS), drain-extended PMOS (DEPMOS), and/or laterally diffused MOS (LDMOS) transistors, as well as groups of DENMOS and DEPMOS, referred to as complimentary drain extended MOS or DECMOS transistors. Described examples include doped regions of various semiconductor structures which may be characterized as p-doped and/or n-doped regions or portions, and include regions that have majority carrier dopants of a particular type, such as n-type dopants or p-type dopants.

The illustrated transistor 101 is an n-channel drain extended transistor (e.g., DENMOS). Other implementations are possible within the scope of the present disclosure, including p-channel drain extended transistor examples (e.g., DEPMOS) using oppositely doped structures and regions. In one example, the substrate 102 is a p-doped silicon substrate or wafer, with a first (e.g., top) side, various buried layers 104, 106 formed therein, and a second (e.g., bottom) side 105. In another possible implementation, the substrate 102 includes one or more epitaxial silicon layers (not shown) formed on a top surface, with one or more of the buried layers 104, 106 in epitaxial layers of the substrate. The illustrated substrate 102 includes a p-type buried layer (PBL) or first doped layer 106 that includes p-type majority carrier dopants. In one implementation, the p-type layer includes a portion implanted with boron to form a p-type buried layer (PBL) with an upper or top side 107, and a further p-doped portion that extends over (e.g., directly on) the p-type buried layer to form the upper side 103 and to provide a composite p-doped first layer 106.

The example substrate 102 in FIG. 1 also includes a second doped layer 104 (e.g., an n-type buried layer or NBL) that includes n-type majority carrier dopants. The second doped layer 104 extends along a first direction (e.g., the vertical Z direction in FIG. 1) from beneath the first doped layer 106 toward the second side 105. In one example, a first epitaxial silicon layer is formed over the upper surface of a silicon wafer, and all or a portion of the first epitaxial layer is implanted with n-type dopants (e.g., phosphorus, etc.) to form the n-type buried layer. In this example, a second epitaxial silicon layer is formed over the first epitaxial layer, and all or a portion of the second epitaxial layer is implanted with p-type dopants (e.g., boron, etc.) to form the p-type buried layer with the upper side 107. In one example, the PBL region is formed using ion implantation through the final silicon surface (e.g., the top of the second epitaxial layer), with a depth set by using a high implantation energy.

The example IC 100 includes an n-channel drain extended transistor 101 (e.g., a DENMOS field effect transistor) with a drain-centered configuration. In other examples, a p-channel drain extended transistor (e.g., a DEPMOS) can be constructed as described below, having oppositely doped structures and regions. The example transistor 101 includes a body region 108 having p-type majority carrier dopants. The body region 108 extends along the Z direction into the first doped layer 106 from the first side 103. The body region 108 includes a channel portion 109 that extends to the top side 103 of the substrate 102. The transistor 101 also includes a source region 110 that extends along the Z direction into the first doped layer 106 from the first side 103. The source region 110 extends laterally along an orthogonal second direction (e.g., the X direction in FIG. 1) adjacent a first (e.g., inner) side of the channel portion 109 of the body region 108. The source region 110 in the illustrated n-channel transistor includes n-type majority carrier dopants (e.g., labeled N+ in the drawings).

The transistor 101 in FIG. 1 has an extended drain structure that includes an oxide structure 111 (e.g., field oxide) that extends along the first side 103 to provide a field gap for a laterally diffused extended drain. The example drain-centered transistor 101 includes gate and source structures that extend laterally around a drain region 112, although not a requirement of all possible implementations. In the illustrated example, the oxide structure 111 laterally encircles a drain region 112. The oxide structure 111 includes a first end (e.g., an outer end) spaced along the X direction from the channel portion 109 of the body region 108, as well as a second (e.g., inner) end. The transistor 101 further includes a drain region 112 that extends along the Z direction into the first doped layer 106 from the first side 103. The drain region 112 includes a first end adjacent the second end of the oxide structure 111 and n-type majority carrier dopants (e.g., labeled N++ in the drawings). In the illustrated example, the field oxide structure 111 is a local oxidation of silicon (LOCOS) structure.

The extended drain structure includes a drift region 113 with a first drift region portion 114 (e.g., connection portion, labeled N+ in the drawings). The first drift region portion 114 extends along the Z direction into the first doped layer 106 from the first side 103, and extends laterally along the X direction from the channel portion 109 of the body region 108 to the first end of the oxide structure 111. The first drift region portion 114 includes n-type majority carrier dopants having a first dopant concentration. In certain examples, the dopant concentration of the first drift region portion 114, and concentrations of other regions in the IC 100, can be profiled and can vary within a range.

The drift region 113 also includes a second drift region portion 116 (e.g., labeled N in the drawings) that includes n-type majority carrier dopants having a second dopant concentration less than the first dopant concentration. The second drift region portion 116 extends between the first drift region portion 114 and the drain region 112. In one example, all or at least a portion of the oxide structure 111 extends between the second drift region portion 116 and the first side 103 along the Z direction. The second drift region portion 116 extends laterally along the X direction from the first drift region portion 114 to the drain region 112. In one example, as discussed further below in connection with FIG. 2, the first and second drift region portions are created by corresponding first and second implantation processes that use a single implant mask and different implant energies. In certain implementations, moreover, the first and second implantation processes use different implant doses, although not a strict requirement of all possible implementations. In addition, the first and second implantation processes can use different dopant species (e.g., phosphorus, arsenic), and the individual first and second implantation processes can be implemented using multiple implants.

The example transistor 101 also includes a gate structure 117 that extends at least partially over the channel portion 109 of the body region 108. The illustrated IC 100 further includes isolation features, including an outer oxide structure 118 that encircles the transistor 101 along the first (e.g., top) side 103. The oxide structure 118 in one example is a shallow trench isolation (STI) structure, which is disposed laterally outward of the source region 110. In the illustrated example, the STI structure 118 defines an end of an active region of the semiconductor substrate 102 in which the transistor 101 is formed. The example STI structure 118 in one example is adjacent to an isolation structure 120 that encircles or surrounds the transistor 101 and the active region of the IC 100. The isolation structure 120 includes a deep n-doped region 122 (e.g., labeled N+) that extends laterally outward of the active region.

In another implementation, the isolation structure can be a deep trench structure with doped sidewall structures (not shown) that extend from the top side 103 of the substrate 102 through the PBL region 106, and into the NBL region 104. In certain examples, the isolation structure includes sidewall structures (not shown) on opposite lateral sides of deposited field oxide structures (not shown) that extend into the lower portion of the p substrate 102 beneath the NBL layer 104. The field oxide structures in this example laterally surround a P+ implanted silicon structure (not shown) that also extends from the first side 103 into the p substrate 102 below the NBL region 104. In one example, the IC 100 further includes contact structures (not shown in FIG. 1) that provide electrical connection to one or more features of the transistor 101, along with a metallization structure (not shown) that covers the transistor 101 and provides internal and/or external electrical interconnection to the transistor source, drain and gate terminals, respectively designated S, D and G in FIG. 1. The metallization structure can include a pre-metal dielectric (PMD) material formed over the illustrated structure, with contact structures formed therein to provide electrical interconnection access for further upper metallization layers (not shown).

The example gate structure 117 laterally encircles the drain region 112. The illustrated gate structure 117 includes a gate dielectric layer 130 formed over the first side 103 of the substrate 102, a patterned gate electrode 132 (e.g., polysilicon) on the gate dielectric layer 130, and lateral sidewall spacers 134 along lateral sides of the patterned gate electrode 132. The gate structure 117 provides an effective channel length 136 (Leff) of the drain extended transistor 101 from a first end of the gate electrode 132 to an inner side of the channel portion 109 along the X direction. In one example, the effective channel length 136 is less than or equal to 0.45 μm. In the example transistor 101 of FIG. 1, the first drift region portion 114 extends along the Z direction into the semiconductor substrate 102 to a first depth, and the second drift region portion 116 extends along the Z direction into the semiconductor substrate 102 to a second depth, where the second depth is greater than the first depth. The example transistor 101 also includes a p-type body contact region 140 laterally adjacent to the source region 110 to provide an electrical connection to the body region 108 (labeled P++ in FIG. 1).

Referring now to FIGS. 2 and 3-12, FIG. 2 shows a method 200 to fabricate an integrated circuit and an extended drain transistor, such as the transistor 101 of FIG. 1. FIGS. 3-12 illustrate processing of the example integrated circuit 100 at various intermediate stages of fabrication to produce the n-channel transistor 101 of FIG. 1 according to the method 200. In other examples, p-channel extended drain transistors can be fabricated according to the method 200 using opposite dopant implantation steps and materials. In certain implementations, the method 200 is used to form planar drift region transistors, as described further below in connection with FIG. 13.

Figure 3:
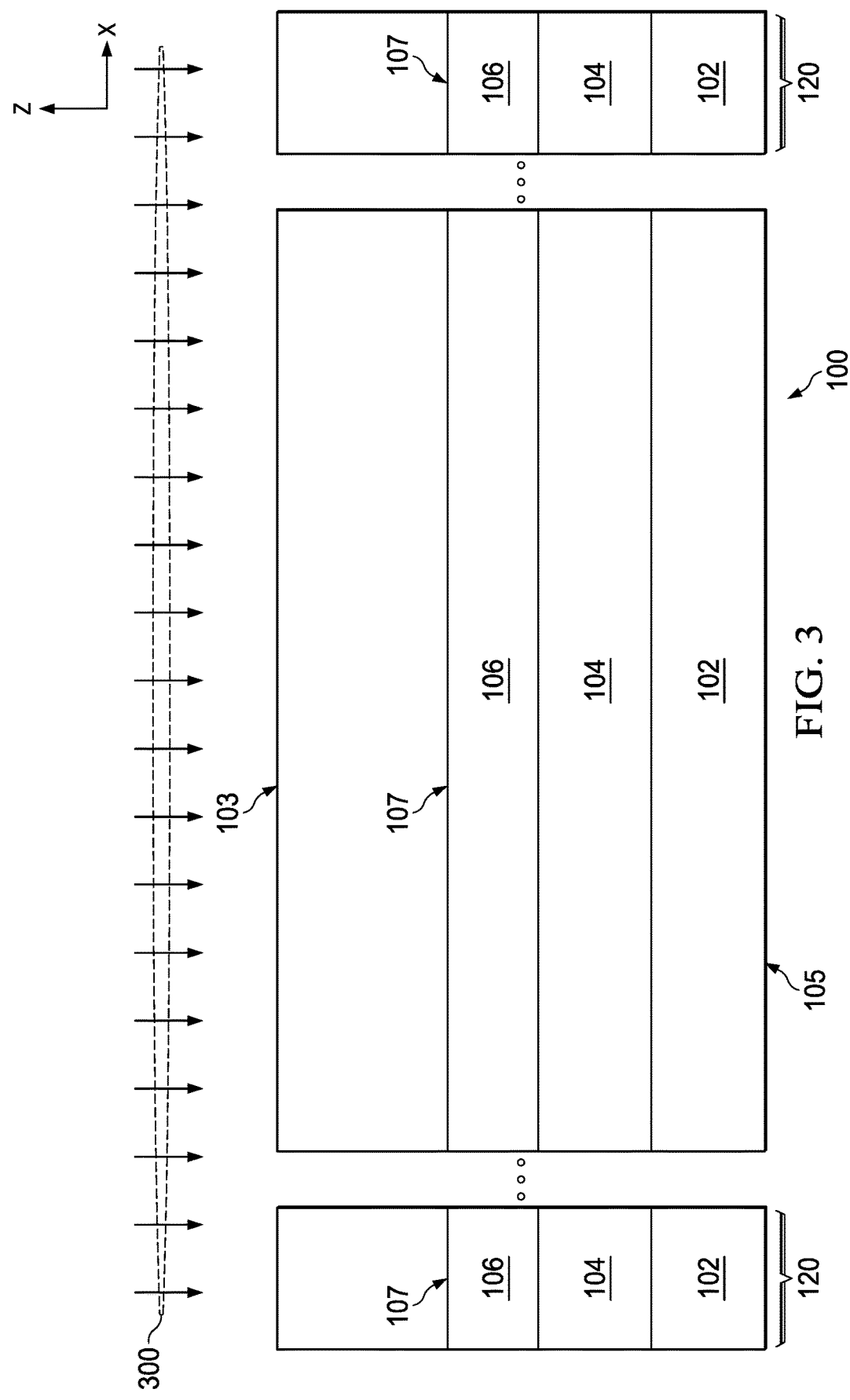
FIGS. 3-12 are partial sectional side elevation views of the integrated circuit at different stages of fabrication to provide the drain extended transistor of FIG. 1.

A starting substrate is provided at 202. In one example, a p-doped silicon wafer substrate is provided at 202, such as the substrate 102 in FIG. 3. The example substrate 102 includes the first (e.g., top) side 103, and a second (e.g., bottom) side 105 as shown in FIG. 3. In another example, a silicon on insulator (SOI) starting wafer is used. A substrate of a different semiconductor material can be provided at 202 in other implementations. In one example, one or more epitaxial layers (not shown) are formed on the substrate 102 using an epitaxial growth deposition process (e.g., at 204 and 208), and the transistor 101 is formed in the epitaxial layer of the substrate 102. In other implementations, the epitaxial layer and the processing at 204 are omitted. In the illustrated example, a first epitaxial silicon deposition process is performed at 204, for example, to form a first epitaxial layer over a silicon substrate 102. At 206, an implantation process is performed, which implants n-type dopants (e.g., phosphorus) into the substrate 102 to form an NBL region in the substrate 102 (e.g., NBL 104 in FIG. 3). In one example, the n-type dopants are implanted via a blanket implantation process 300 in FIG. 3 into the first epitaxial layer at 206, followed by deposition of a second epitaxial layer over the NBL doped layer 104 at 208. At 210, an implantation process is performed (not shown), which implants p-type dopants (e.g., boron) into the second epitaxial layer of the substrate 102 to form a p-doped layer (e.g., PBL 106) in the substrate 102 above the NBL region 104. In one possible implementation, the drain extended transistor 101 is subsequently formed on and/or in the second epitaxial layer.

Figure 4:
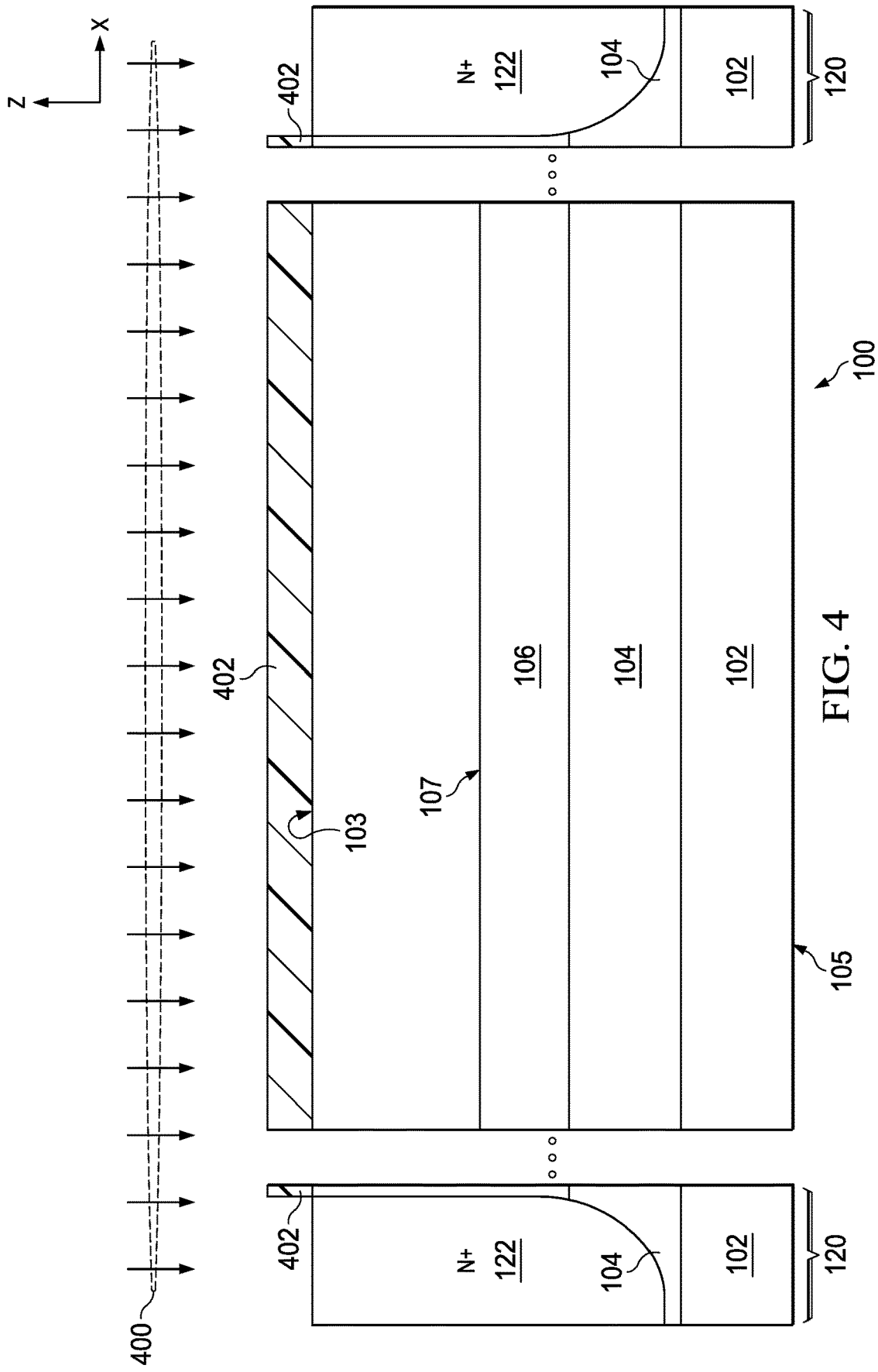

The illustrated method 200 in one example includes forming an isolation structure at 212 that surrounds an active region of the substrate and any deposited epitaxial layers (e.g., isolation structure 120 in FIG. 1). In one example, a masked implantation process is performed at 212, which implants n-type dopants into exposed portions of the structure outside the prospective active region to form a deep n-doped region. FIG. 4 illustrates one example, in which a deposition process 400 implants phosphorus or other n-type dopants using an implantation mask 402, to form the deep n-doped region 122 (e.g., labeled N+) that extends laterally outward of the active region. In one implementation, the n-doped region 122 is implanted with suitable implantation energy to extend into at least an upper portion of the NBL region 104.

Figure 2:
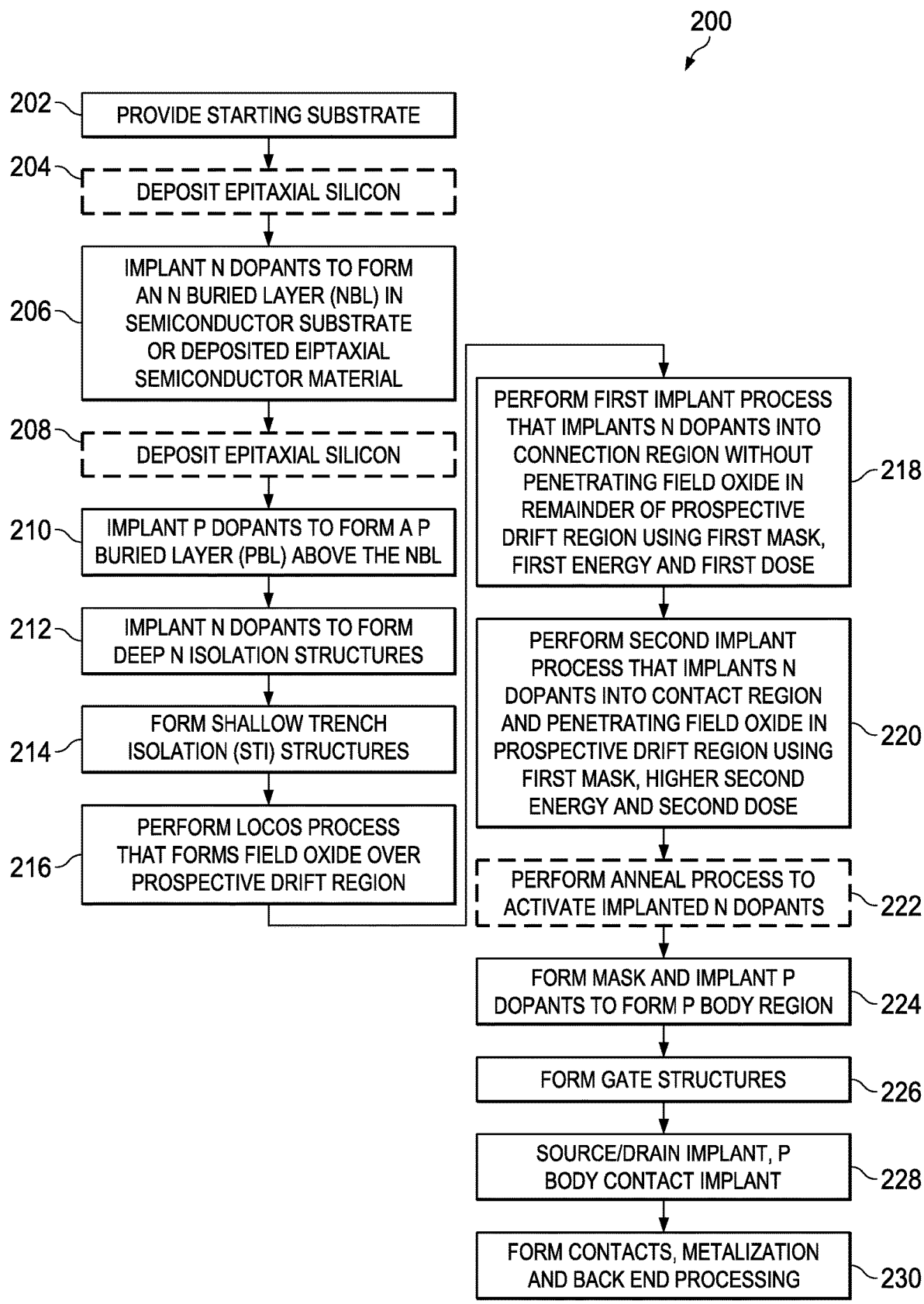
FIG. 2 is a flow diagram showing a method for making a drain extended transistor.
Figure 5:
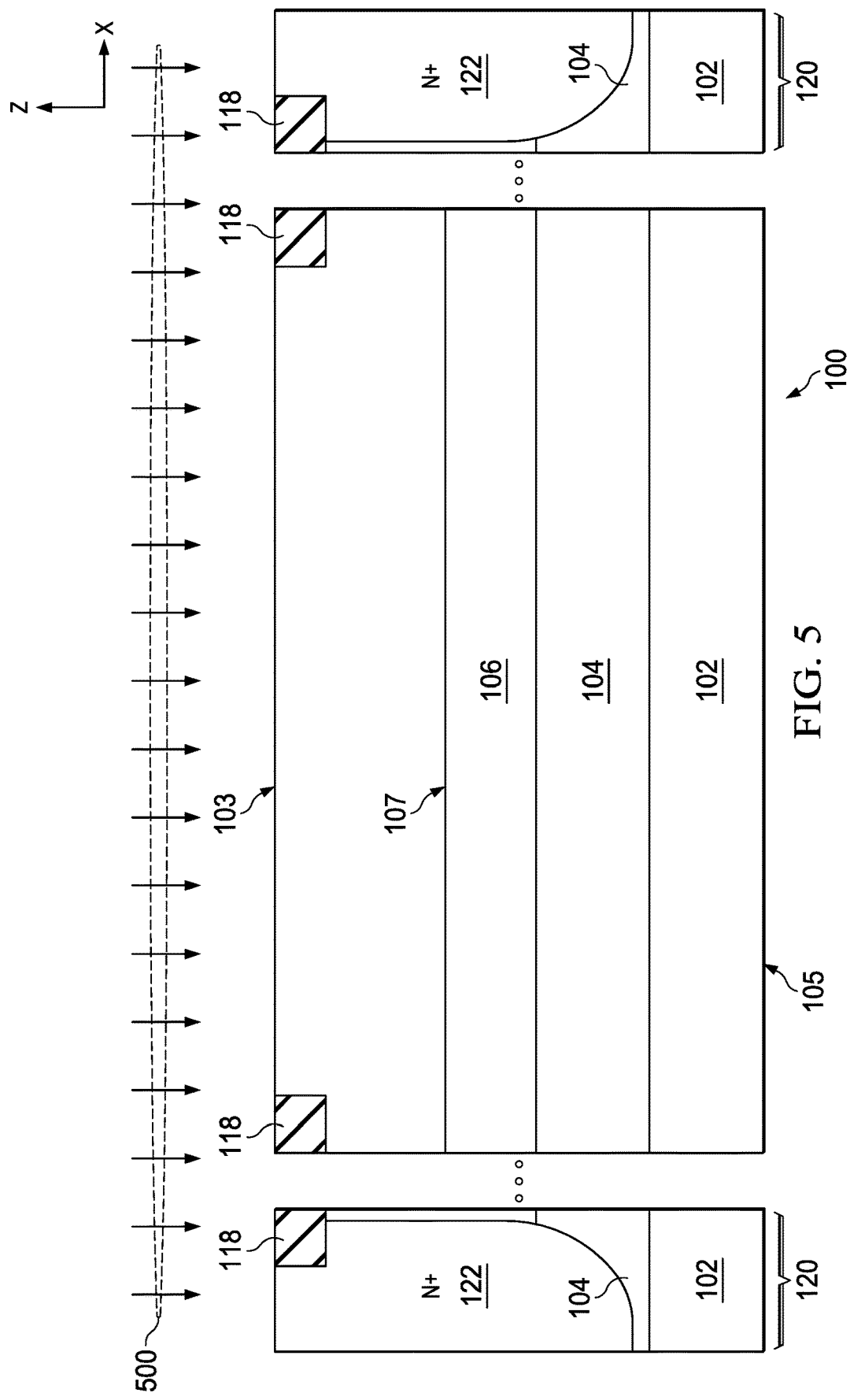

The method 200 continues at 214 in FIG. 2 with a shallow trench isolation process 500 in FIG. 5 to form the isolation structure 118 (labeled STI in FIG. 5). In one example, the isolation structure 118 is formed laterally outward of the prospective source region using the process 500. In one example, trenches are etched and filled with oxide to form the structure 118. Other processes can be used, such as LOCOS processing at 220 to form the isolation structure 118. In one example, the STI isolation structure 118 in FIG. 1 extends downward into the substrate to a depth of approximately 0.35 μm. The isolation structure 118 may, but need not, have an upper surface that is generally coplanar with the upper surface of the substrate 102.

In another example, the isolation structure 120 can be fabricated using deep trench processing techniques. In one example, a trench is etched through the PBL layer 106 and the NBL layer 104 and into the portion of the p substrate 102 beneath the NBL layer 104. An N+ implantation is performed to dope trench sidewall structures (not shown) to a depth into the NBL layer 104, and the sidewalls are oxidized to form field oxide structures (not shown). A silicon deposition process is performed with in-situ P+ doping to form a p-doped structure between the oxide structures, leaving a deep trench isolation structure (not shown).

Figure 6:
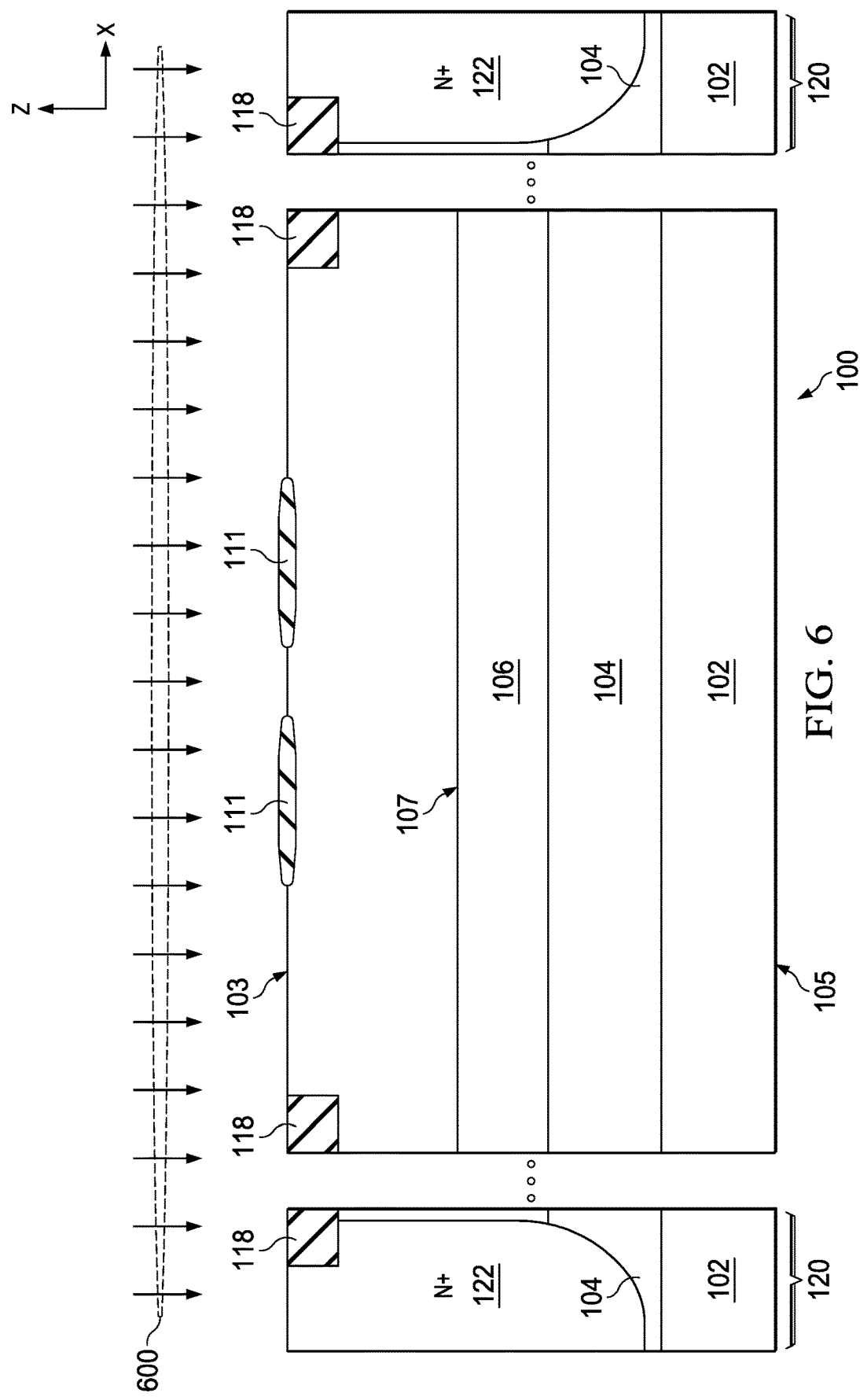

The method 200 also includes forming an oxide structure at 216 along the first side 103 of the semiconductor substrate 102. In the example of FIG. 6, a local oxidation of silicon (LOCOS) process 600 is performed, which forms the oxide structure 111 along the top side 103 in a portion of a prospective drift region 113 (FIG. 1). Other oxide formation processes can be performed at 216 in other implementations. In one example, the oxide structure 111 is formed at 216 to a thickness of 500 angstroms or more and 1500 angstroms or less. In another example, the oxide structure 111 is formed at 216 to a thickness of 700 angstroms or more and 1100 angstroms or less. In a further example, the oxide structure 111 is formed at 216 to a thickness of 800 angstroms or more and 1000 angstroms or less.

Figure 7:
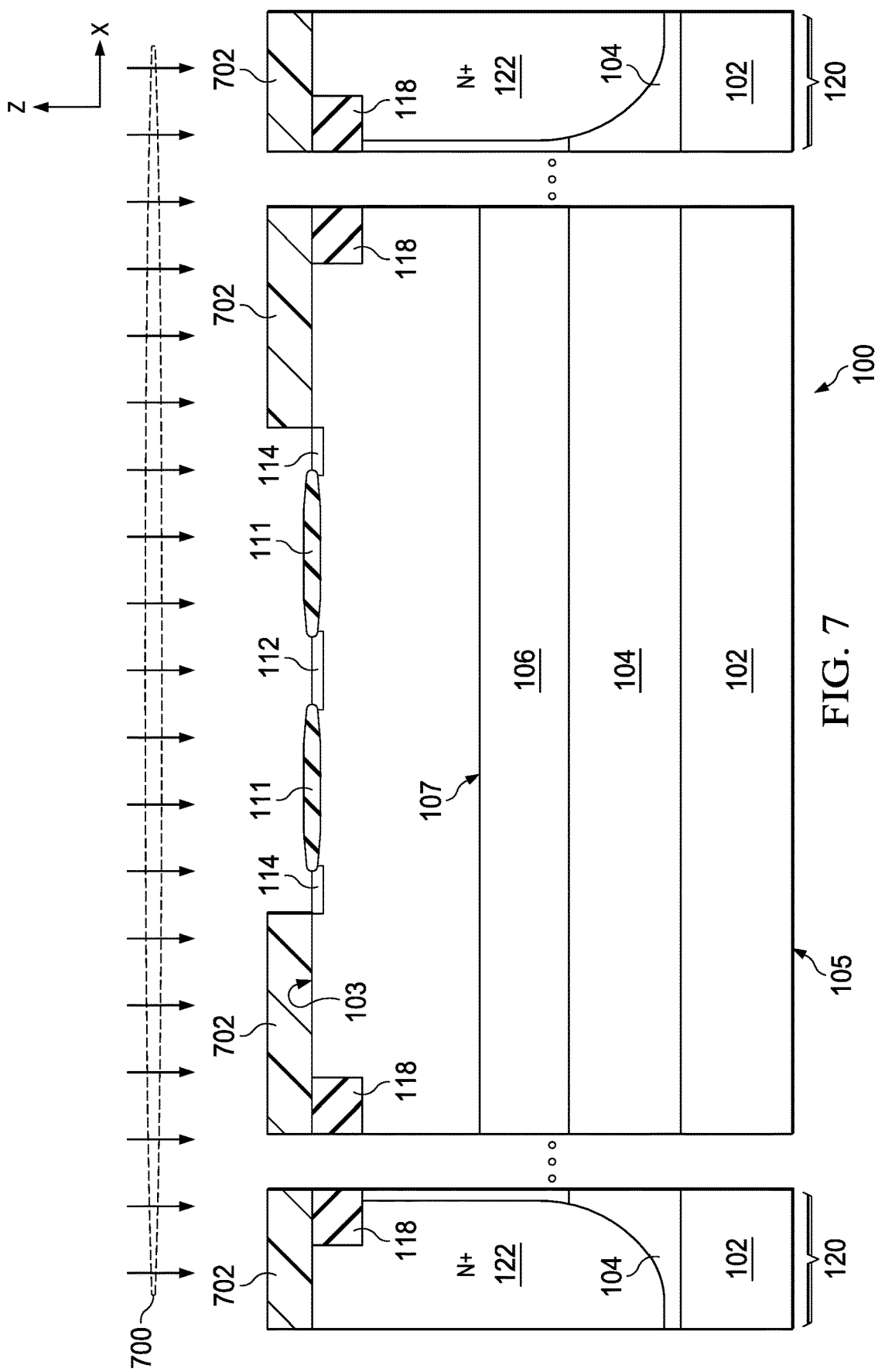

At 218 in FIG. 2, a first implantation process is performed (e.g., implantation process 700 in FIG. 7), which implants n-type dopants into the semiconductor substrate 102 at a first energy and a first dopant concentration using a first mask 702. In the example of FIG. 7, the first mask 702 is formed, which covers prospective source and body regions, and exposes the oxide structure 111 and a first portion of the first side 103 of the semiconductor substrate 102. The implantation process 700 (218 in FIG. 2) forms the first drift region portion 114 that extends into the semiconductor substrate 102 along the Z direction from the first portion of the first side 103. In the example of FIG. 7, moreover, the first mask 702 exposes the prospective drain region 112 laterally outward of the oxide structure 111 along the X direction. In this example, the process 700 also implants the n-type dopants into the drain region 112. In other implementations, the mask 702 covers the prospective drain region 112. In one example, the oxide structure 111 at least partially blocks the dopants from the first implantation process 700. In various implementations, the thickness of the oxide structure 111 along the vertical (Z) direction is tuned in combination with the implant energy of the first implantation process 700 to completely or substantially block implantation of dopants in the first implantation process at 218 into the substrate 102 beneath the oxide structure 111. In one example, the first implantation process 700 implants phosphorus dopants at the first energy of 20-40 keV and the first dose of $2\text{-}8\times10^{12}$ $cm^{-2}$. In one implementation, the first implantation process 700 implants phosphorus dopants at the first energy of 20-40 keV for an oxide thickness of 700-1100 angstroms. In another example, the first dose is $2\text{-}5\times10^{12}$ $cm^{-2}$.

Figure 8:
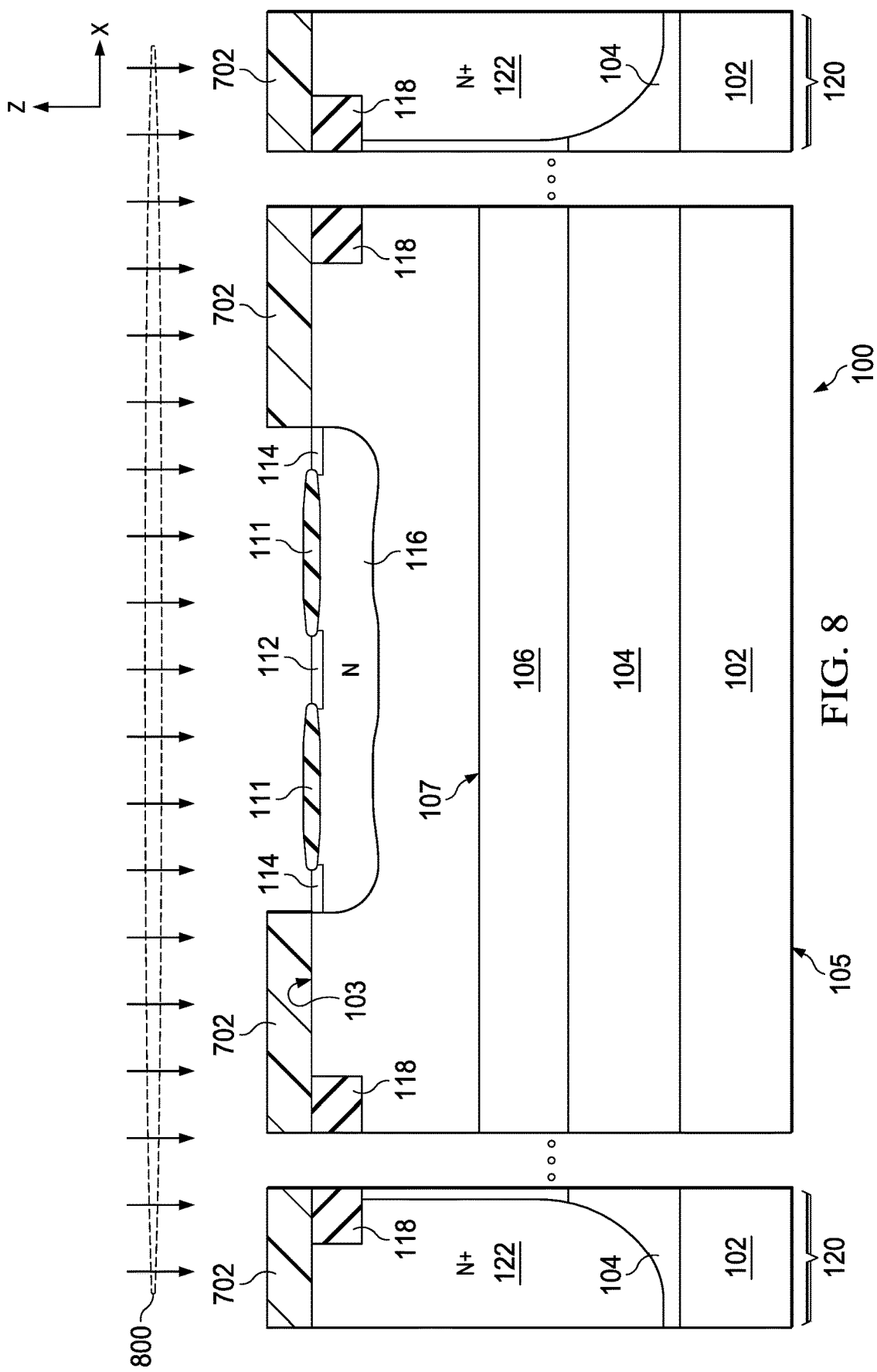

The method 200 in FIG. 2 also includes performing a second implantation process at 220 using the first mask 702. FIG. 8 shows one example in which a second implantation process 800 is performed, which implants n-type dopants into the semiconductor substrate 102 at a second energy and a second dopant concentration using the first mask 702. The implantation at 220 forms the second drift region portion 116 that extends into the semiconductor substrate 102 under the oxide structure 111 along the Z direction. In one example, the second energy is greater than the first energy. In one example, the second implantation process 800 implants phosphorus dopants at the second energy of 70-350 keV and the second dose of $2-5\times10^{12}$ cm$^{-2}$. In one example, the second implantation process 800 implants phosphorus dopants at the second energy less than or equal to 150 keV. In one example, the second implantation process 800 implants phosphorus dopants at the second energy greater than or equal to 100 keV, such as 100-350 keV. In one example, the second implantation process 800 includes more than one implant, for example, an implantation at 120 keV, and another implantation at 250 keV.

Figure 9:
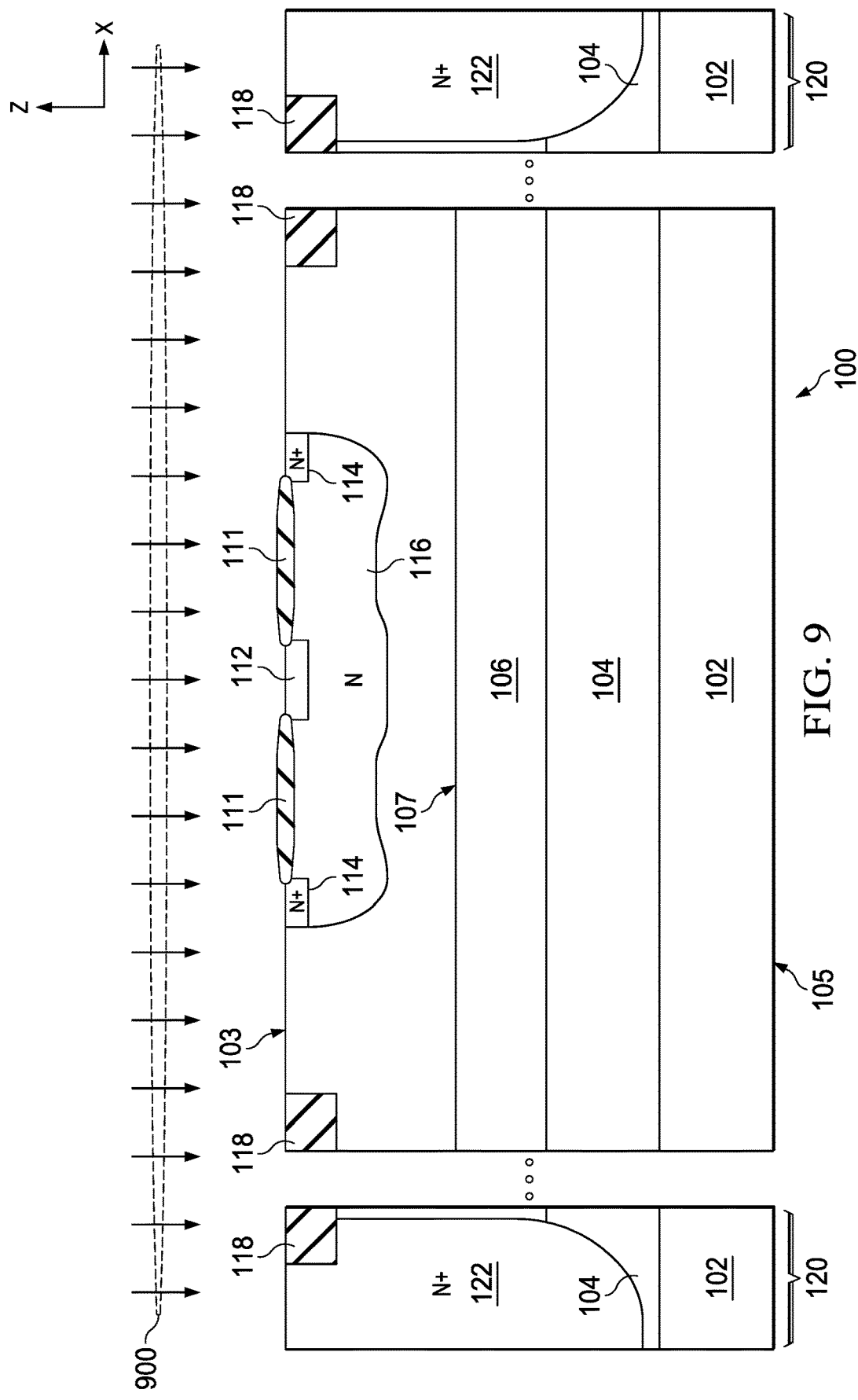

Referring also to FIG. 9, in one example, a thermal anneal process is performed at 222, which activates the n-type dopants implanted at 218 and 220. FIG. 9 shows an example thermal anneal process 900 following the second implantation process at 220 in FIG. 2. The annealing 900 drives the implanted dopants in the regions 112, 114 and 116 deeper into the substrate 102 as shown in FIG. 9. In another example, the thermal anneal process at 216 is omitted.

Figure 10:
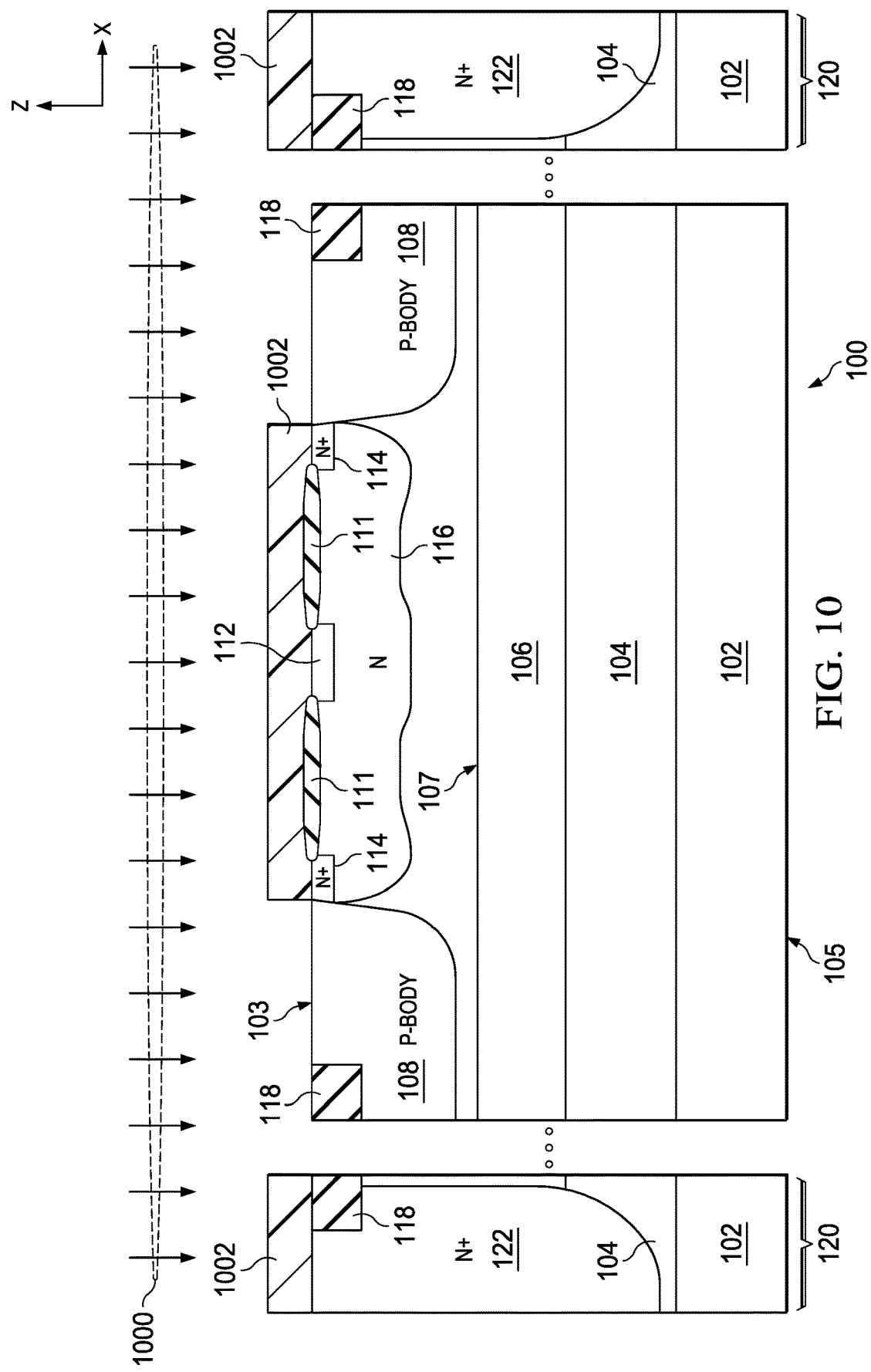

At 224 in FIG. 2, the method 200 further includes forming a source/drain implant mask and implanting p-type dopants to form a body region. FIG. 10 shows an example implantation process 1000 performed using a mask 1002, which forms the body region 108. The implanted body region 108 includes a channel portion 109 laterally adjacent the first drift region portion 114 along the X direction (FIG. 1).

Figure 11:
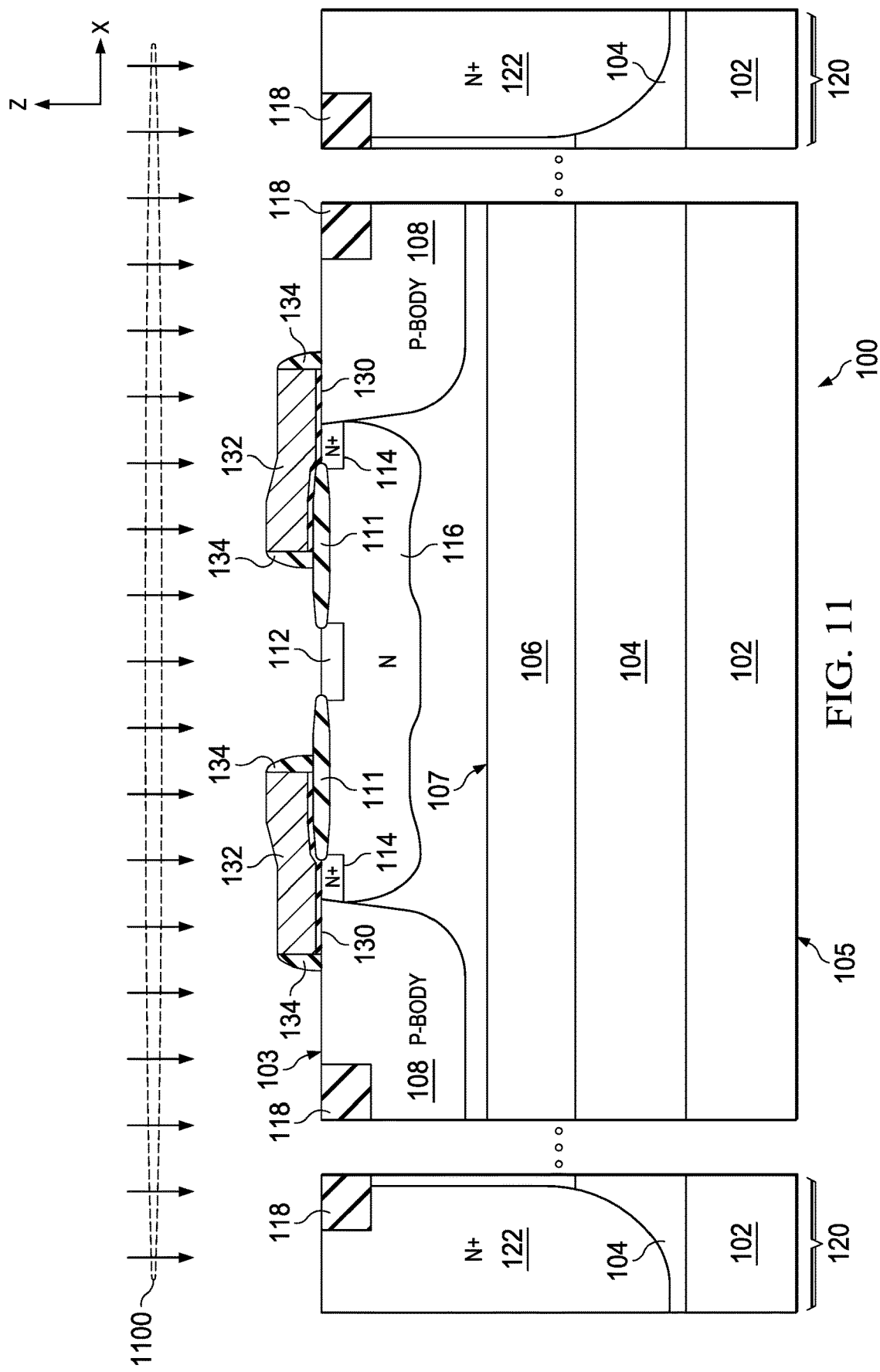

The example method 200 also includes forming a gate structure at 226. FIG. 11 shows an example, and which gate fabrication processing 1100 is performed to form the gate structure 117 over the channel portion 109 of the body region 108 and over a portion of the oxide structure 111. The gate dielectric layer 130 in this example extends over the channel region 109 of the body region 108, and extends over the connection (e.g., first) drift region portion 114 and a portion of the oxide structure 111 to form a short channel compact gate configuration to control the prospective drain extended transistor. The gate electrode 132 in this example is patterned polysilicon formed over a portion of the gate dielectric layer 130, and sidewall spacers 134 are formed along the lateral sides of the polysilicon gate electrode 132.

Figure 12:
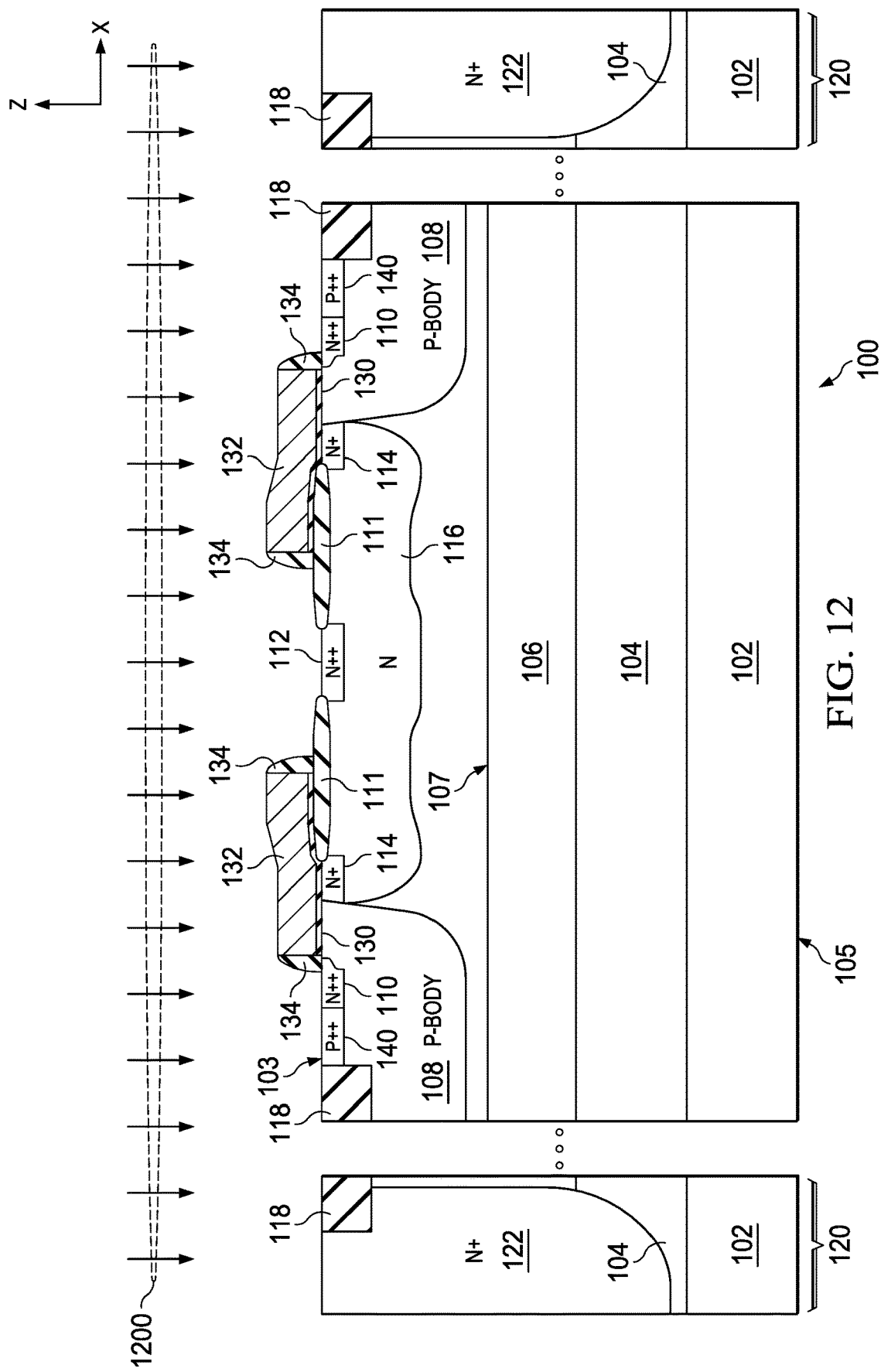

The method 200 continues at 228 in FIG. 2, including implanting the source region 110 and the drain region 112 with n-type dopants. FIG. 12 shows an example, in which an implantation process 1200 is performed with an implant mask (not shown). The implantation process 1200 implants phosphorus or other n-type dopants to form the source region 110 adjacent the channel portion 109 of the body region 108, and the drain region 112 adjacent the second drift region portion 116 and the oxide structure 111. The implantation process 1200 in one example supplements the previously implanted n-type dopants in the drain region 112. In one example, the processing at 228 also includes performing a masked implantation process (not shown) to implant p-type dopants (e.g., boron), to form the p-type body contact region 140 shown in FIG. 1. The method 200 also includes further processing at 230, which forms contacts, metallization structures and to complete other back end processes to finish the integrated circuit 100.

Figure 13:
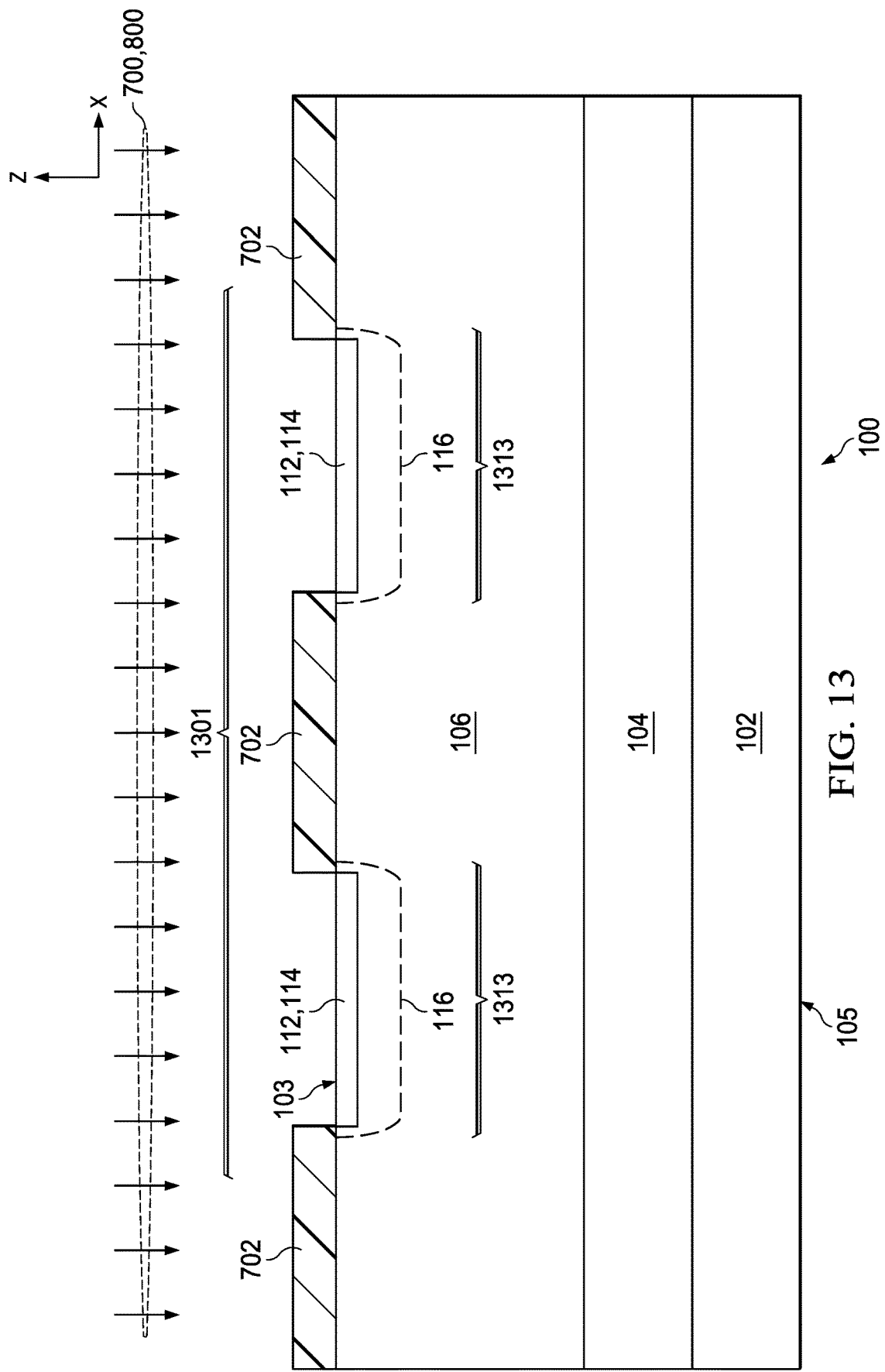
FIG. 13 is a partial sectional side elevation view of a planar drain extended transistor undergoing implantation processing during fabrication of the integrated circuit.

FIG. 13 shows a planar drain extended transistor in one implementation of the IC 100, undergoing implantation processing during the first and second implantation processes 700 and 800. In this example, the first mask 702 exposes a second drift region 1313 of a prospective planar transistor 1301 in the semiconductor substrate 102. The first and second implantation processes 700, 800 implant the corresponding n-type dopants into the second drift region 1313. This advantageously allows use of a single mask 702 in fabricating planar and field relief drain extended transistors in a single integrated circuit 100.

Disclosed examples facilitate fabrication of a transistor drift region with a first implantation (e.g., a shallow implant) fully or partially blocked by the field relief oxide structure 111. The second implantation uses the shared first mask 702 for the second implantation at a higher implant energy to form the lower concentration second portion of the drift region 113. The higher dopant concentration in the implanted first drift region portion 114 helps mitigate channel hot carrier issues proximate the channel region of the gate polysilicon 132. The disclosed examples, moreover, facilitate increased doping in the first drift region portion 114 beyond the limits imposed by the resurf condition under the field relief oxide, and the disclosed examples provide processes and drain extended transistor structures that enable the doping dose in the region 116 under the field relief oxide, and the doping level in the connection region 114 under the polysilicon channel region 109 to be engineered separately. Moreover, disclosed examples use the shared implant mask 702 without adverse impact on manufacturing cost.

Specific implementations can be tailored to fabricate any desired blocking voltage rating, and can be used to separately tailor planar as well as field relief drain extended devices in a single integrated circuit 100. In one example, the process can be tailored by selection of at least two different drift region implant energies such that (i) the low-energy component is blocked by the field relief oxide 111 and only contributes substantial implant dose to the connection region 114 of the channel near the channel region 109, and (ii) one or more higher energy components are able to penetrate the field relief oxide 111 and provide a total doping dose in the region 116 that is compatible with high voltage drift region depletion in a reverse blocking state of the transistor 101. As shown in FIG. 13, moreover, for a planar drain extended transistor construction using the same drift region implant, the doping includes the dopants provided by the first and second implantation processes 700 and 800. In one example, an implantation dose is used for the second implantation process 800 beyond a limit imposed by the resurf condition. This facilitates low on-resistance (RDSON) for lower-voltage planar drain extended devices without adding a separate drift region implant mask and process.

In one example, the effective channel length of the device Leff=0.45 μm, X=0.3 μm, and the design provides Leff–X=0.15 μm separation between the drift region implant edge and the source end of the gate polysilicon 132. In further examples, tighter lithographic processes can be used to provide X less than 0.3 μm, in which case the surface implant dose can be scaled so that the lateral dose of the connection region 114 is roughly constant (e.g., X.dose is approximately constant).

Modifications are possible in the described embodiments, and other embodiments are possible, within the scope of the claims.

The following is claimed:

1. A drain extended transistor, comprising:
   a body region in a semiconductor substrate, the body region including: majority carrier dopants of a first type; and a channel portion;
   a source region in the semiconductor substrate, the source region adjacent the channel portion of the body region, the source region including majority carrier dopants of a second type;

an oxide structure that extends along a first side of the semiconductor substrate, the oxide structure including: a first end spaced nearer the channel portion of the body region; and a second end opposite the first end;

a drain region in the semiconductor substrate, the drain region including majority carrier dopants of the second type, wherein the second end of the oxide structure is adjacent the drain region;

a drift region, including:
   a first drift region portion in the semiconductor substrate at the first side, the first drift region portion extending from the channel portion of the body region to the first end of the oxide structure, the first drift region portion including majority carrier dopants of the second type having a first dopant concentration; and
   a second drift region portion separated from the first side by at least a portion of the oxide structure, the second drift region portion extending from the first drift region portion to the drain region, the second drift region portion including majority carrier dopants of the second type having a second dopant concentration less than the first dopant concentration; and a gate structure, including a gate dielectric layer formed over the first side of the semiconductor substrate, and a gate electrode on the gate dielectric layer.

2. The transistor of claim 1, wherein the majority carrier dopants of the first type are p-type dopants, and the majority carrier dopants of the second type are n-type dopants.

3. The transistor of claim 2, wherein an effective channel length of the drain extended transistor is less than or equal to 0.45 μm.

4. The transistor of claim 2, wherein the first drift region portion extends to a first depth, wherein the second drift region portion extends to a second depth, and wherein the second depth is greater than the first depth.

5. The transistor of claim 1, wherein an effective channel length of the drain extended transistor is less than or equal to 0.45 μm.

6. The transistor of claim 5, wherein the first drift region portion extends to a first depth, wherein the second drift region portion extends to a second depth, and wherein the second depth is greater than the first depth.

7. The transistor of claim 1, wherein the first drift region portion extends to a first depth, wherein the second drift region portion extends to a second depth, and wherein the second depth is greater than the first depth.

8. An integrated circuit (IC), comprising:
a semiconductor substrate, including: a first side; and a second side spaced from the first side along a first direction;
a first doped layer in the substrate, the first doped layer including majority carrier dopants of a first type; and
a drain extended transistor, comprising:
   a body region that extends along the first direction into the first doped layer from the first side, the body region including: majority carrier dopants of the first type; and a channel portion;
   a source region that extends along the first direction into the first doped layer from the first side, the source region adjacent a first side of the channel portion of the body region, the source region including majority carrier dopants of a second type;
   an oxide structure that extends along the first side, the oxide structure including: a first end spaced along a second direction from the channel portion of the body region; and a second end;
   a drain region that extends along the first direction into the first doped layer from the first side, the drain region including: majority carrier dopants of the second type, and a first end adjacent the second end of the oxide structure; and
   a drift region, including:
      a first drift region portion that extends along the first direction into the first doped layer from the first side, the first drift region portion extending along the second direction from the channel portion of the body region to the first end of the oxide structure, the first drift region portion including majority carrier dopants of the second type having a first dopant concentration; and
      a second drift region portion separated from the first side along the first direction by at least a portion of the oxide structure, the second drift region portion extending along the second direction from the first drift region portion to the drain region, the second drift region portion including majority carrier dopants of the second type having a second dopant concentration less than the first dopant concentration; and
   a gate structure, including a gate dielectric layer formed over the first side of the substrate, and a gate electrode on the gate dielectric layer.

9. The IC of claim 8, wherein the majority carrier dopants of the first type are p-type dopants, and the majority carrier dopants of the second type are n-type dopants.

10. The IC of claim 8, wherein an effective channel length of the drain extended transistor is less than or equal to 0.45 μm.

11. The IC of claim 8, wherein the first drift region portion extends along the first direction into the first doped layer to a first depth, wherein the second drift region portion extends along the first direction into the first doped layer to a second depth, and wherein the second depth is greater than the first depth.

12. The IC of claim 8, further comprising a second doped layer that extends along the first direction from the first doped layer toward the second side of the semiconductor substrate, the second doped layer including majority carrier dopants of the second type.

13. A method to fabricate a drain extended transistor, the method comprising:
providing a semiconductor substrate, including: a first side; a second side spaced from the first side along a first direction; and a first doped layer that includes majority carrier dopants of a first type;
forming an oxide structure along the first side of the semiconductor substrate;
providing a first mask along the first side of the semiconductor substrate to expose the oxide structure and a first portion of the first side of the semiconductor substrate;
performing a first implantation process that implants dopants of a second type into the semiconductor substrate at a first energy and a first dopant concentration using the first mask to form a drain region and a first drift region portion that extend into the semiconductor substrate along the first direction from the first portion of the first side, the oxide structure located between the drain region and the first drift region portion; and
performing a second implantation process that implants dopants of the second type into the semiconductor substrate through the drain region, oxide structure and first drift region portion at a second energy and a second dopant concentration using the first mask to form a second drift region portion that extends into the semiconductor substrate along the first direction under the oxide structure, the drain region and the first drift region, the second energy being greater than the first energy;

implanting dopants of the first type to form a body region having a channel portion adjacent the first drift region portion along a second direction;

forming a gate structure over the channel portion of the body region and over a portion of the oxide structure; and implanting dopants of the second type into the body region to form a source region adjacent the channel portion of the body region, and into the drain region.

14. The method of claim 13, wherein the first mask exposes a second drift region of a prospective planar transistor in the semiconductor substrate; and wherein the first and second implantation processes implant the dopants of the second type into the second drift region.

15. The method of claim 13, wherein the dopants of the first type are p-type dopants, and the dopants of the second type are n-type dopants.

16. The method of claim 13, wherein the oxide structure blocks the dopants from the first implantation process.

17. The method of claim 13, wherein forming the oxide structure includes forming the oxide structure to a thickness of 50 nm or more and 150 nm or less.

18. The method of claim 17, wherein forming the oxide structure includes forming the oxide structure to a thickness of 70 nm or more and 110 nm or less.

19. The method of claim 17, wherein forming the oxide structure includes forming the oxide structure to a thickness of 80 nm or more and 100 nm or less.

20. The method of claim 13, wherein performing the first implantation process includes implanting phosphorus dopants at the first energy of 20-40 keV, and the first dose of $2\text{-}8\times10^{12}$ atoms·cm$^{-2}$.

21. The method of claim 20, wherein performing the second implantation process includes implanting phosphorus dopants at the second energy of 70-350 keV, and the second dose of $2\text{-}5\times10^{12}$ atoms·cm$^{-2}$.

22. The method of claim 21, wherein performing the second implantation process includes implanting phosphorus dopants at the second energy less than or equal to 150 keV.

23. The method of claim 21, wherein performing the second implantation process includes implanting phosphorus dopants at the second energy greater than or equal to 100 keV.

24. A method of forming an integrated circuit, comprising:

forming an oxide structure along a top surface of a semiconductor substrate having a first conductivity type;

implanting dopants of a second conductivity type opposite the first conductivity type into the semiconductor substrate at a first energy and a first dopant concentration thereby forming a drain region and a first drift region portion that both extend into the semiconductor substrate, the oxide structure located between the drain region and the first drift region portion; and implanting dopants of the second conductivity type into the semiconductor substrate through the drain region, the oxide structure and the first drift region portion at a greater second energy and a second dopant concentration thereby forming a second drift region portion that extends into the semiconductor substrate under the oxide structure, the drain region and the first drift region;

implanting dopants of the first conductivity type thereby forming a body region adjacent the first drift region portion at the top surface;

forming a gate structure over the body region and over a portion of the oxide structure; and implanting dopants of the second conductivity type into the drain region, and into the body region adjacent the gate structure thereby forming a source region.

* * * * *